United States Patent
Kim et al.

(10) Patent No.: US 7,409,627 B2
(45) Date of Patent: Aug. 5, 2008

(54) METHOD FOR TRANSMITTING AND RECEIVING VARIABLE LENGTH PACKETS BASED ON FORWARD ERROR CORRECTION (FEC) CODING

(75) Inventors: Hyun-Cheol Kim, Daejeon (KR); Kyu-Heon Kim, Daejeon (KR); Jin-Woong Kim, Daejeon (KR); Doug-Young Seo, Seongnam (KR)

(73) Assignees: Electronics and Telecommunications Research Institute (KR); Kyung Hee University (KR)

( * ) Notice: Subject to any disclaimer, the term of this patent is extended or adjusted under 35 U.S.C. 154(b) by 696 days.

(21) Appl. No.: 10/428,730

(22) Filed: May 2, 2003

(65) Prior Publication Data

US 2003/0226092 A1 Dec. 4, 2003

(30) Foreign Application Priority Data

May 3, 2002 (KR) .................. 10-2002-0024387

(51) Int. Cl.
*H03M 13/27* (2006.01)
(52) U.S. Cl. .................................... 714/776
(58) Field of Classification Search ............... 714/776, 714/779
See application file for complete search history.

(56) References Cited

U.S. PATENT DOCUMENTS

| | | | |
|---|---|---|---|
| 5,115,436 A * | 5/1992 | McAuley | 714/781 |
| 5,550,640 A | 8/1996 | Tsuboi et al. | |
| 5,636,316 A | 6/1997 | Oku et al. | |
| 5,642,365 A * | 6/1997 | Murakami et al. | 714/761 |
| 5,724,345 A * | 3/1998 | Guarneri et al. | 370/316 |
| 5,852,706 A * | 12/1998 | Ogikubo et al. | 386/111 |
| 5,883,891 A * | 3/1999 | Williams et al. | 370/356 |
| 6,000,053 A * | 12/1999 | Levine et al. | 714/766 |
| 6,012,159 A * | 1/2000 | Fischer et al. | 714/755 |
| 6,029,265 A | 2/2000 | Itoi et al. | |
| 6,061,820 A * | 5/2000 | Nakakita et al. | 714/751 |
| 6,081,907 A * | 6/2000 | Witty et al. | 714/6 |
| 6,141,788 A * | 10/2000 | Rosenberg et al. | 714/774 |
| 6,160,844 A * | 12/2000 | Wilkinson | 375/240 |
| 6,243,846 B1 * | 6/2001 | Schuster et al. | 714/776 |
| 6,285,681 B1 | 9/2001 | Kolze et al. | |
| 6,317,462 B1 * | 11/2001 | Boyce | 375/240.27 |
| 6,487,690 B1 * | 11/2002 | Schuster et al. | 714/752 |

(Continued)

FOREIGN PATENT DOCUMENTS

EP 1 176 835 1/2002

(Continued)

OTHER PUBLICATIONS

"An RTP Payload Format for Generic Forward Error Correction", J. Rosenberg, Prior Art LIterature, Dec. 1999, 26 pages.

*Primary Examiner*—Stephen M. Baker
(74) *Attorney, Agent, or Firm*—Blakely Sokoloff Taylor & Zafman (57) ABSTRACT

A method for transmitting variable length packets based on FEC coding. Data packets are successively and contiguously stored in a two-dimensional storage device. FEC coding is performed to generate parity packets. The parity packets are stored in the two-dimensional storage device. The data packets, offsets representing positions of the data packets in the two-dimensional storage device, types of packets, and the parity packets are then transmitted.

23 Claims, 6 Drawing Sheets

U.S. PATENT DOCUMENTS

| | | | |
|---|---|---|---|
| 6,745,364 B2 * | 6/2004 | Bhatt et al. | 714/774 |
| 6,895,019 B2 * | 5/2005 | Gibson et al. | 370/473 |
| 7,003,712 B2 * | 2/2006 | Martinian et al. | 714/761 |
| 7,017,102 B1 * | 3/2006 | Kristensson et al. | 714/786 |

FOREIGN PATENT DOCUMENTS

| | | |
|---|---|---|
| EP | 1 185 101 | 3/2002 |
| JP | 06-216963 | 8/1994 |
| JP | 07-087099 | 3/1995 |
| JP | 07-240749 | 9/1995 |
| JP | 07-336692 | 12/1995 |
| JP | 09-102745 | 4/1997 |
| JP | 11-136220 | 5/1999 |
| JP | 11-185399 | 7/1999 |
| JP | 2000-308052 | 11/2000 |
| KR | 1019980052678 | 12/1998 |
| KR | 1999-0067037 | 8/1999 |

* cited by examiner

METHOD FOR TRANSMITTING AND RECEIVING VARIABLE LENGTH PACKETS BASED ON FORWARD ERROR CORRECTION (FEC) CODING

CROSS REFERENCE TO RELATED APPLICATION

This application is based on Korea Patent Application No. 2002-24387 filed on May 3, 2002 in the Korean Intellectual Property Office, the content of which is incorporated herein by reference.

BACKGROUND OF THE INVENTION (a) Field of the Invention

The present invention relates to a method for transmitting and receiving variable length packets on the basis of the FEC coding. More specifically, the present invention relates to a method for transmitting and receiving variable length packets on the basis of the FEC coding for generating parity packets of the variable length packets without padding to recover lost packets, and enabling a transmitter to immediately transmit data packets.

(b) Description of the Related Art

Digital communication systems use the ARQ (automatic repeat request) method or the FEC (forward error correction) method so that a receiver may control packet losses generated at a channel during data transmission.

The ARQ method includes a stage for analyzing whether received data blocks have errors or are lost, and a stage for requesting retransmission of blocks that have errors or are lost. The ARQ method is not suitable for a system that has many errors and is strict with delay.

The FEC method transmits data with additional data so that the receiver may detect errors and recover data without retransmission of the error data. The FEC method includes the Hamming code, the BCH code, and the RS (Reed Solomon) code. In particular, the RS code allows per-byte error detection and correction.

In the IETF document "An RTP Payload Format for Generic Forward Error Correction" (IETF(Internet Engineering Task Force) RFC(Request For Comment Document) 2733, December 1999) proposed by J. Rosenberg et al., exclusive-or calculation is used.

A single parity packet for each set of packets is transmitted in a separate stream. When a packet is lost from the corresponding set, it can be restored by a receiver. In order to be compatible with a host that does not support the FEC method, the parity packet has a predetermined RTP (Real-time Transport Protocol) payload type value. The host that does not know the RTP payload type value ignores a received parity packet and executes the original process according to a previous IETF document of "RTP: A Transport Protocol for Real-Time Application" (IETF RFC 1889, January 1996) by H. Schulzrine.

Also, according to "An Improved UDP Protocol for Video Transmission Over Internet-to Wireless Networks" (IEEE Tr. On Multimedia, pp. 356-365, September 2001) by H. Zheng, and "An Adaptive Redundancy Control Method for Erasure-Code Based Real-Time Data Transmission Over the Internet" (IEEE Tr. On Multimedia, pp. 366-374, September 2001) shortened RS codes are used for restoring erased packets. When k data packets are transmitted together with (n-k) parity packets, even if (n-k) packets are lost to the maximum, they may be restored by the receiver. Serial numbers of the lost packets can be detected by the receiver using an RTP protocol. (The term erasure is defined to be loss or an error at a known position.) The above-noted method has more packet loss protection than RFC 2733 since more than one packet may be restored by using the method. The method for restoring at least one packet proposed by Wagner is currently under the process of standardization by the IETF ("draft-ietf-avt-uxp-02.txt: An RTP payload format for erasure-resilient transmission of progressive multimedia streams," March 2002).

Figure 10:
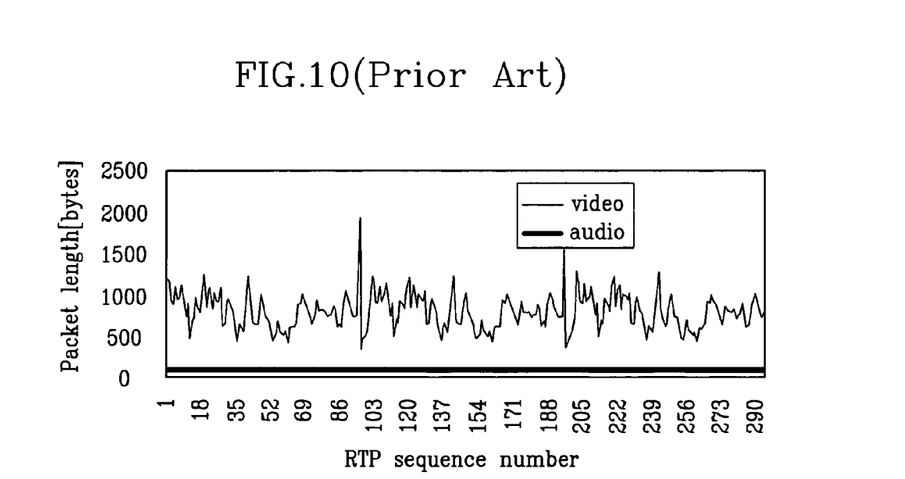
FIG. 10 shows video with a packet size substantially varying from 150 to 3,000 bytes, and audio having a fixed packet size of 112 bytes.

The above methods are applied on the assumption that the length of the packets is fixed. The length of the packets of compressed audio is fixed, and the length of the packets of compressed video is variable in most cases as shown in FIG. 10.

Accordingly, when the length of packets to be transmitted is variable and much delay is not allowed in the like manner of recent Internet video services, it is required to use the FEC method and modify it to be suitable for streams of variable length packets.

Figure 6:
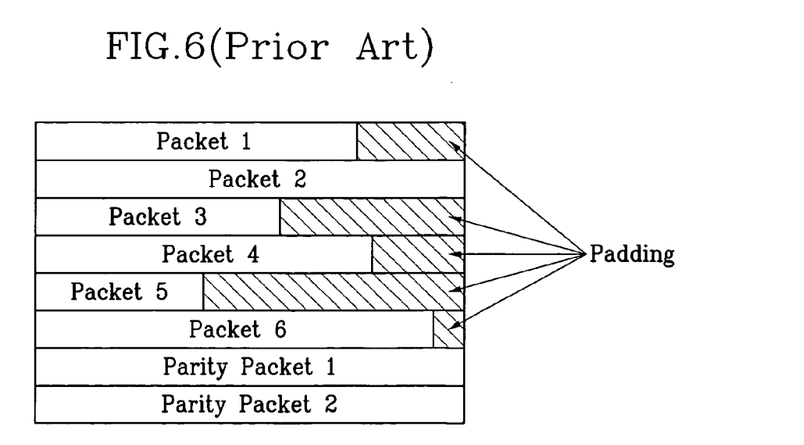
FIG. 6 shows a brief diagram for arranging the variable length packets on the basis of the conventional FEC coding.

Because the conventional FEC coding methods are based on the same length packets, the methods have a weak point that a padding process is required to obtain the same length packets as shown in FIG. 6. Also, since the length of the parity packets would be the same as the longest length of the packets in an associated packet group, a bandwidth is wasted. And since a transmitter does not transmit input packets until the associated packet group including the first packet through the sixth packet is input so as to detect the packet of the longest length, delay is problematically generated.

SUMMARY OF THE INVENTION

It is an advantage of the present invention to provide a method for transmitting and receiving variable length packets on the basis of the FEC coding for generating parity packets of variable length packets successively stored in a two-dimensional storage device without applying a padding process, and immediately transmitting data packets although all the data of the associated packet group for generating the parity packets are not input to minimize transmission delay, and restoring at least one lost packet by using at least one packet of the associated packet group.

In one aspect of the present invention, a method for transmitting variable length packets on the basis of FEC (forward error correction) coding comprises: (a) receiving data packets when input data packets to be transmitted are provided; and (b) successively storing and arranging the input data packets in a two-dimensional data array which has a predetermined length, and performing the FEC coding to generate corresponding parity packets in the two-dimensional data array, and transmitting the data packets, offsets that represent positions of the data packets in the two-dimensional data array, information on types of packets, and the parity packets.

The method further comprises before (a): (c) determining whether predetermined parameters for the FEC coding are to be used; and (d) determining the parameters for the FEC coding and transmitting them when the predetermined parameters for the FEC coding are not used.

The step (b) comprises: (i) accumulating values of factors for determining whether to transmit the parity packets; (ii) successively storing and arranging the input data packets in the two-dimensional data array, (iii) updating parity packets according to the input data packets; (iv) transmitting extension data packets including the input data packets and information for data packet restoration; (v) determining whether it is time to transmit the parity packets; (vi) transmitting the parity packets when it is the time to transmit the parity packets in (v); and (vii) resetting the factors for determining whether to transmit the parity packets in (i). The factors for determining whether to transmit the parity packets in (i) and (vii) are determined according to factors for determining an associated packet group. When the factor for determining the associated packet group is a threshold size of the associated packet group, the factor for determining whether to transmit the parity packets is a size of the input data packets, when the factor for determining the associated packet group is a threshold number of the data packets, the factor for determining whether to transmit the parity packets is the number of the input data packets, and when the factor for determining the associated packet group is a threshold time, the factor for determining whether to transmit the parity packets is a lapsed time.

The step (vi) comprises: determining the number of the parity packets to be transmitted; determining whether the number of the transmitted parity packets is equal to or greater than the number of the parity packets to be transmitted; transmitting an extension parity packet including one of the parity packets to be transmitted and the information for data packet restoration when the determined number of the transmitted parity packets is less than the number of the parity packets to be transmitted; accumulating the number of the transmitted parity packets; and resetting the parity packets and the number of the transmitted parity packets when the determined number of the transmitted parity packets is equal to or greater than the determined number of the parity packets to be transmitted.

In another aspect of the present invention, a method for receiving variable length packets on the basis of the FEC coding comprises: (a) receiving extension packets, each of the extension packets including one of the variable length packets, successively storing and arranging them in a two-dimensional data array which has a predetermined storage length; and (b) performing FEC decoding to restore data packets from the received extension packets and delivering the data packets to an upper layer.

The method further comprises before (a): (c) determining whether predetermined parameters for the FEC decoding are to be used; and (d) receiving parameters for the FEC coding when the predetermined parameters for the FEC coding are not to be used.

The step (a) comprises: (i) receiving the extension packet; (ii) determining whether the received extension packet is an extension data packet or an extension parity packet; (iii) separating the data packet and information for data packet restoration when the received extension packet in (ii) is an extension data packet including the data packet; (iv) separating the parity packet and information for data packet restoration when the received extension packet in (ii) is an extension parity packet including the parity packet; and (v) sequentially arranging the separated data packet and the parity packet in (iii) or (iv) in the predetermined two-dimensional storage device.

The step (b) comprises: (i) determining whether it is time to deliver the associated packet group to an upper layer; and (ii) delivering the separated data packets to the upper layer when it is determined to be the time to deliver the associated packet group to an upper layer.

The time to deliver the associated packet group to the upper layer may be a time when the last packet in the associated packet group or a packet in a subsequent associated packet group arrives, or a time when a predetermined time has lapsed.

The step (ii) comprises: (ii-i) determining whether the separated data packets have a lost portion; (ii-ii) determining whether the data packets have a restorable portion when the data packets have a lost portion; (ii-iii) restoring the lost data packets when the lost portion is restorable in (ii-ii); (ii-iv) determining whether all lost portion can not be restored in (ii-iii); (ii-v) delivering lost positions to the upper layer when it is determined that no restorable portion remains in (ii-ii) or when a portion is not restored in (ii-iv); and (ii-vi) delivering the received data packets to the upper layer when no data packet is lost in (ii-i), or delivering the received data packets including the restored data packets to the upper layer when data are restored in (ii-iii).

BRIEF DESCRIPTION OF THE DRAWINGS

The accompanying drawings, which are incorporated in and constitute a part of the specification, illustrate an embodiment of the invention, and together with the description, serve to explain the principles of the invention:

FIGS. 8($a$) and 8($b$) show a brief method for restoring lost packets among received packets in the method for receiving the variable length packets on the basis of the FEC coding according to a preferred embodiment of the present invention, 8($a$) showing a state that all lost portions can be restored, and 8($b$) showing a state that a part of the lost portions can not be restored.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
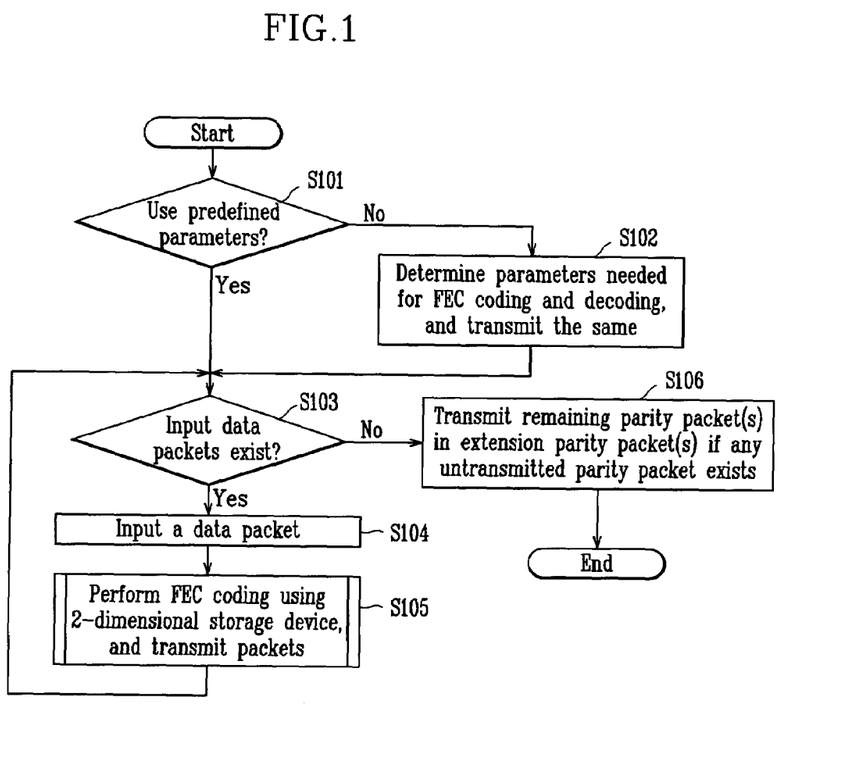
FIG. 1 shows a flowchart of a method for transmitting variable length packets on the basis of the FEC coding according to a preferred embodiment of the present invention.

FIG. 1 shows a flowchart of a method for transmitting variable length packets on the basis of the FEC coding according to a preferred embodiment of the present invention.

As shown, a transmitter performs the method for transmitting variable length packets on the basis of the FEC coding.

The transmitter determines whether to use predefined values for parameters needed for the FEC coding and decoding in step S101.

When it is determined that the predefined parameters are not to be used, the transmitter determines parameters necessary for the FEC coding and decoding, and transmits them to a receiver in step S102.

When it is determined that the predefined parameters are to be used, the step S102 of determining parameters necessary for the FEC coding and decoding, and transmitting them to a receiver may be omitted.

In this instance, the parameters required for the FEC coding and decoding represent a length of a two-dimensional storage device for storing the transmitted packets, the number of the parity packets, and a factor for determining an associated packet group. A "two-dimensional storage device" hereinafter refers to a storage device that may be physically or logically configured as a two-dimensional data array. Here, the associated packet group includes a set of a data packet and corresponding parity packets, and factors for determining them may be a threshold size of the associated packet group, a threshold number of the associated packet group, and a threshold time.

Next, the transmitter determines whether an input data packet to be transmitted exists in step S103, and when it is found that the data packet exists the transmitter receives the data packet in step S104, uses the two-dimensional storage device to perform FEC coding on the input data, and transmits the same to the receiver in step S105. While the input data packet exists as described above, the step S104 for inputting the data packet and the step S105 for performing the FEC coding and transmitting the packets are repeatedly executed.

When no data packets are input in the previous determination step S103, untransmitted parity packets, if any exist, are sent to the receiver in step 106 and the transmitting process is terminated.

Figure 2:
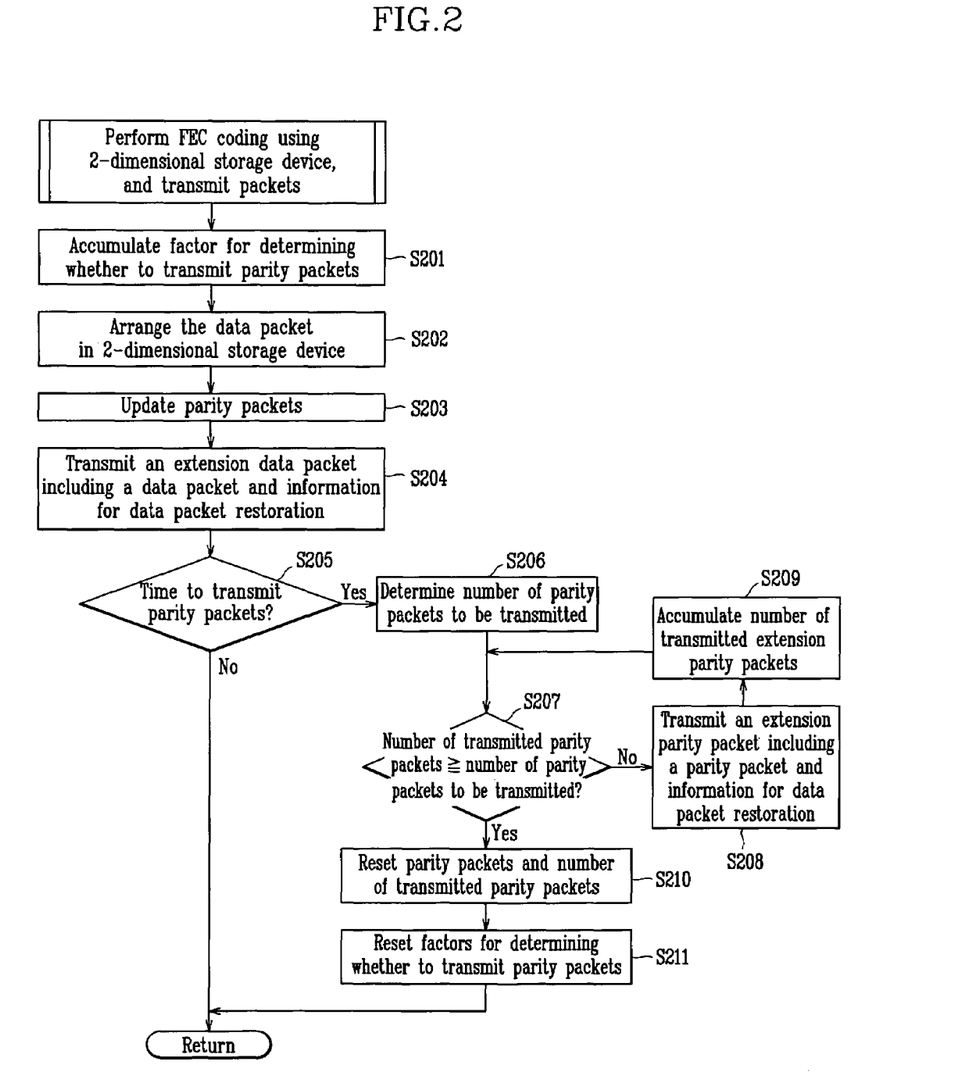
FIG. 2 shows a flowchart for the FEC coding and the packet transmission shown in FIG. 1.

FIG. 2 shows a flowchart for the FEC coding and packet transmission (i.e., S105) shown in FIG. 1.

Figure 7:
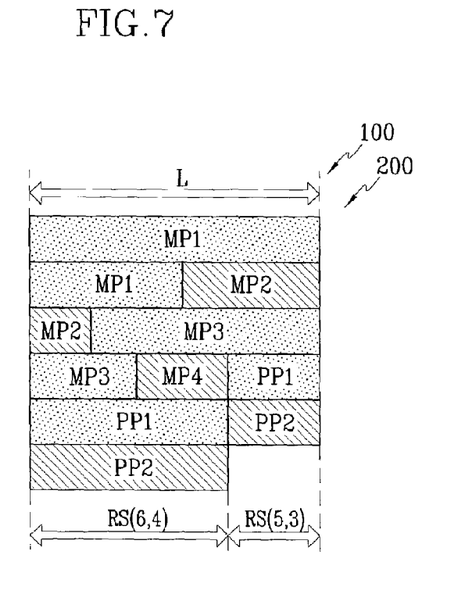
FIG. 7 shows a brief diagram for arranging the variable length packets on the basis of the FEC coding according to a preferred embodiment of the present invention.

As shown, when the data packet is input in the previous step S104, values of the factors for determining whether to transmit the parity packets are accumulated in step S201, and the input data packet is stored in the two-dimensional storage device 100 having a storage length of L such that the input data packet and previously-accumulated data packets are successively and sequentially arranged in step S202 as shown in FIG. 7. The factors for determining the transmission state of the parity packets include a size of the data packet, or the number of the data packets, or time information.

In this instance, the operation of successively storing the data packets in the two-dimensional storage device 100 and arranging them represents to concatenate the packets and store them in the two-dimensional storage device 100 with a storage length to be a length L of the two-dimensional storage device 100.

Here, the length L of the two-dimensional storage device 100 may be modified, and it is provided to the receiver through a certain transmission method. A fixed length L may be transmitted during a call, or the length L may be adaptively modified during a call according to a channel state and a packet length, and transmitted to the receiver.

Referring to FIG. 7, since the size of the first input data packet MP1 is greater than the length L of the two-dimensional storage device 100, a portion of the first packet MP1 matched with the length of the two-dimensional storage device 100 is arranged in advance, and a remaining portion of the first packet MP1 is arranged on the next line. The size of the second packet MP2 is less than the length L of the two-dimensional storage device 100, but a predetermined portion of the second packet MP2 is arranged to a remaining portion occupied by a portion of MP1, and a remaining portion of the second packet MP2 is arranged on the next line. The arrangement method for the second packet MP2 may also be identically applied to the third and fourth packets MP3 and MP4.

The FEC algorithm calculates parity packets of (n-k) digits and outputs them according to the packet data on the identical column of bits referring to FIG. 7. In this case, various systematic FEC algorithms may be used, but the shortened RS coding in $GF(2^8)$ may be conventionally used. Here, since two parity bits are generated with respect to the first column of bits of the two-dimensional storage device 100, two parity bits are generated with respect to the second column of bits, two parity bits are continuously generated with respect to subsequent columns of bits, and finally, two parity bits are generated with respect to the last $L^{th}$ column of bits that matches the storage length L of the two-dimensional storage device 100, finally generated two parity packets become parity packets PP1 and PP2 that respectively have a length L identical with that of the two-dimensional storage device 100. That is, parity packets corresponding to a predetermined length unit, in particular, a byte unit is calculated by vertically calculating the data arranged in the two-dimensional storage device 100. For example, the notation RS(6,4) in FIG. 7 represents that four vertically-aligned input data units, for example, 4 bits of input data are vertically calculated to output (6−4=2)-byte parity packets, and also represents that lost packets from among (4+2=6) packets may be restored up to two packets to the maximum.

Positions of the respective packets are to be reported to the receiver, and for this purpose, reserved fields in the RTP packet header or extension fields defined and usable by a user may be used. Also, so as to notify of the positions, offsets may be used per byte from a connection start point of the associated packet.

Figure 9:
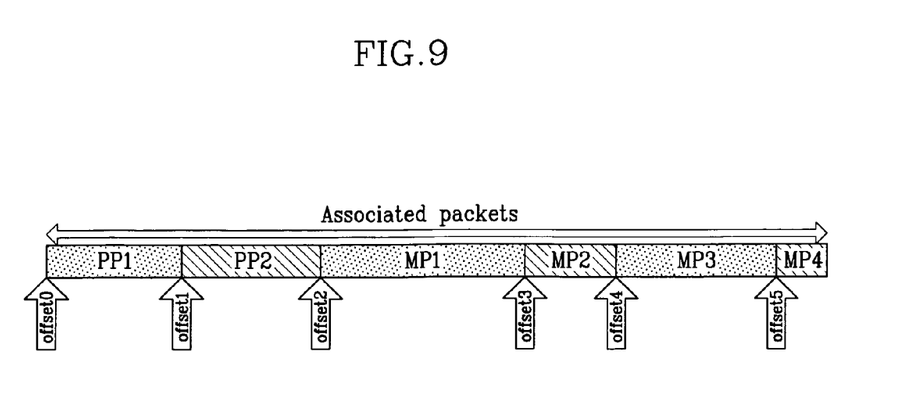
FIG. 9 shows offsets of the respective packets in the method for transmitting the variable length packets on the basis of the FEC coding according to the preferred embodiment of the present invention.

The offsets may be included in the extension fields of the RTP packet header for the respective packets, and for example, application of this to the case of FIG. 7 results in the case of FIG. 9. In this instance, a transmission order from the transmitter to the receiver is defined to be the first packet P1, the second packet P2, the third packet P3, the fourth packet P4, the first parity packet PP1, and the second parity packet PP2.

When a single data packet is input as described above, the corresponding parity packet is continuously updated in step S203, and an extension data packet including information for data packet restoration and the data packet is transmitted to the receiver in step S204. Here, a header of the extension data packet includes information for data packet restoration.

Further, information for data packet restoration includes packet types and packets' offsets in the case of data packets, and it includes packet types, a total size of the data packets in the associated packet group, and respective data packets' offsets in the case of parity packets.

Updates of the parity packets are performed per byte by vertically calculating the data of the two-dimensional storage device 100 for each byte, and the extension data packet including the data packet comprises offsets for placing the position of corresponding data packets in the two-dimensional storage device 100, packet types, and data packets.

In the case of using a protocol such as the RTP (real-time transport protocol), the offsets may be placed in an extension field and then transmitted, and the RTP packet becomes the extension packet.

When the parity packet is updated in the previous step S203, it is determined whether it is time to transmit the parity packet in step S205.

The determination of whether to transmit the parity packet depends on the factors for determining an associated packet group. In the case that the factor for determining the associated packet group is a threshold size of the associated packet group, it is determined to be a time for transmitting parity packets when an accumulated value of sizes of the input data packets is equal to or greater than the threshold size, in the case that the factor is a threshold number of the data packets, it is determined to be a time for transmitting parity packets when the number of the input data packets is equal to or greater than the threshold number, and in the case that the factor is a threshold time, it is determined to be a time for transmit parity packets when a lapsed time is equal to or greater than the threshold time. The determination is not restricted to the above-noted factor usage since various other factors may be used to determine the transmission states.

When it is determined not to be a time for transmitting the parity packets, it returns to the previous step S103 of determining whether to input the data packets.

When it is determined to be a time for transmitting the parity packets, the number of the parity packets to be transmitted is determined according to a channel state in step S206. That is, the number of the currently transmitted parity packets is reduced when the channel state is good, and the number of the parity packets is increased and transmitted when the channel state is bad, in order to improve received image quality. Information on the channel state is transmitted and received using the RTCP (real-time transport control protocol).

Next, the number of the transmitted parity packets is compared in step S207 with the number of the parity packets to be transmitted, determined in the previous step S206, and when the number of the transmitted parity packets is less than the number of the parity packets to be transmitted, the extension parity packet including information for data packet restoration and the parity packets is transmitted in step S208, and the number of the transmitted parity packets is accumulated in step S209. In this instance, the extension parity packet includes a size of the total data packets in the associated packet group, a packet type, and a parity packet. It may further include offsets of the respective data packets, and the offsets may be used for restoring the data packets having no code for representing a boundary between packets.

However, when the number of the transmitted parity packets is equal to or greater than the parity packets to be transmitted, the parity packets and the number of the transmitted parity packets are reset in step S210, a value of the factor for determining whether to transmit the parity packets is also reset, and it returns to the previous step S103 of determining whether input data packet exists in step S211.

As described above, sequentially input data packets are connected and arranged to the last portion of the previous data packet, and the previous step S105 of performing FEC coding and transmitting the packets by using the two-dimensional storage device 100 is repeatedly performed according to the preferred embodiment of the present invention shown in FIG. 2.

In the above, a method for transmitting variable length packets on the basis of the FEC coding has been described according to the preferred embodiment of the present invention, and a corresponding receiving method will now be described.

Figure 3:
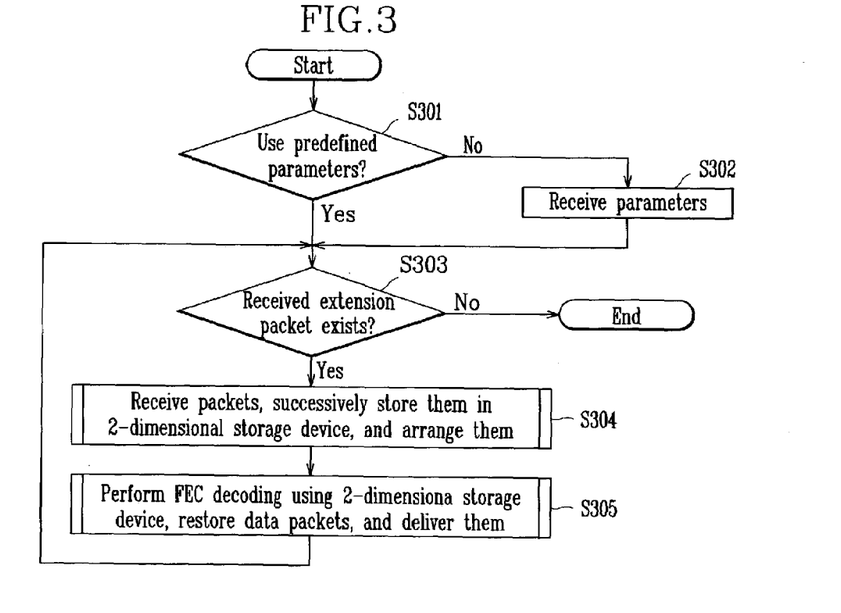
FIG. 3 shows a flowchart of a method for receiving variable length packets on the basis of the FEC coding according to a preferred embodiment of the present invention.

FIG. 3 shows a flowchart of a method for receiving variable length packets on the basis of the FEC coding according to a preferred embodiment of the present invention.

As shown, the receiver performs the method for receiving variable length packets on the basis of the FEC coding.

First, the receiver determines whether to use predefined values for the parameters need for the FEC decoding in step S301, and when not using the predefined parameters, the receiver receives the parameters from the transmitter in step S302 and uses them, and when using the predefined parameters, the step S302 of receiving the parameters may be omitted.

Next, the receiver determines whether extension packets are received from the transmitter in step S303, and when they are found, it receives them, successively stores them in a two-dimensional storage device 200, and arranges them in step S304, performs FEC decoding by using the two-dimensional storage device 200, restores data packets, and delivers the restored data packets to an upper layer in step S305. While the received extension packets exist as described above, the step S304 of receiving the extension packets, connecting and arranging them, and the step S305 of performing FEC decoding, restoring the data packets, and delivering them are repeatedly performed.

Also, the receiving process is terminated when no extension packets are received in the previous determination step S303.

Figure 4:
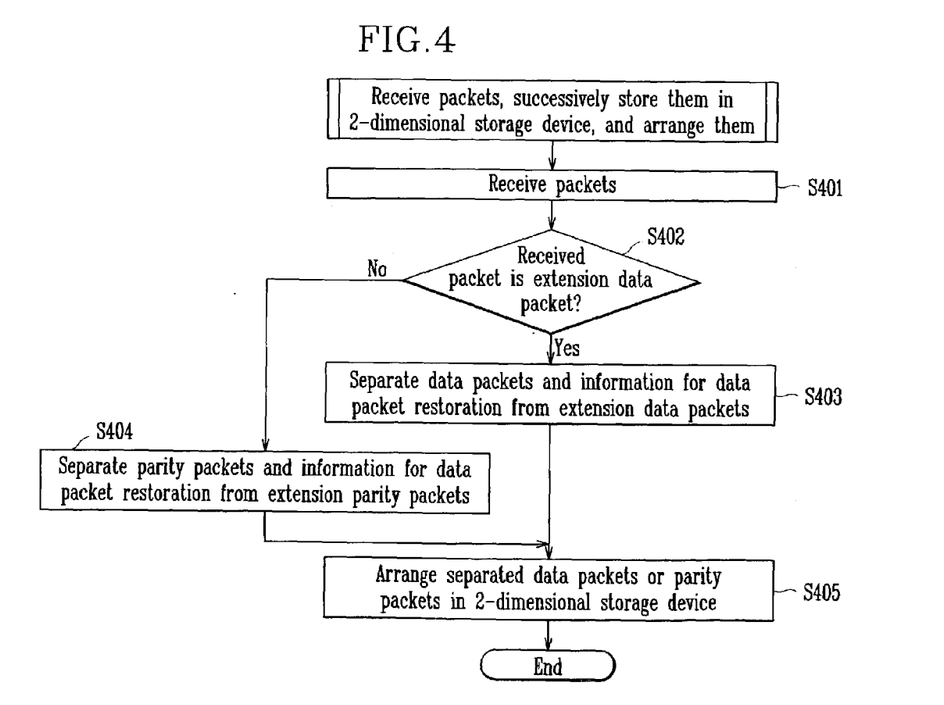
FIG. 4 shows a flowchart of the stage for receiving packets, successively storing them in a two-dimensional storage device, and arranging them shown in FIG. 3.

FIG. 4 shows a flowchart of the step S304 for receiving the packets of FIG. 3, successively storing them in the two-dimensional storage device, and arranging them.

As shown, when receiving the extension packets from the transmitter in step S401, the receiver determines whether the extension packets are extension data packets or extension parity packets in step S402, and when they are found to be extension data packets, the receiver separates data packets and information for restoring data packets included in the extension packet header from the extension data packets in step S403, and when they are found to be extension parity packets, the receiver separates parity packets and information for restoring the data packets from the extension parity packets in step S404.

After this, the receiver successively stores the separated data packets or parity packets in the two-dimensional storage device 200 of FIG. 7 and arranges them in step S405. In this instance, the arrangement of data packets and parity packets in two-dimensional storage device 200 is the same as that of data packets and parity packets in two-dimensional storage device 100. That is, since positions of the respective packets arranged in the two-dimensional storage device 100 or offsets of associated packets from a connection start point are reported to the receiver from the transmitter, the format arranged to the two-dimensional storage device 200 of the receiver becomes identical. Therefore, different reference numerals are applied to the identical drawing shown in FIG. 7 to represent the transmitter's two-dimensional storage device 100 and the receiver's two-dimensional storage device 200.

Figure 5:
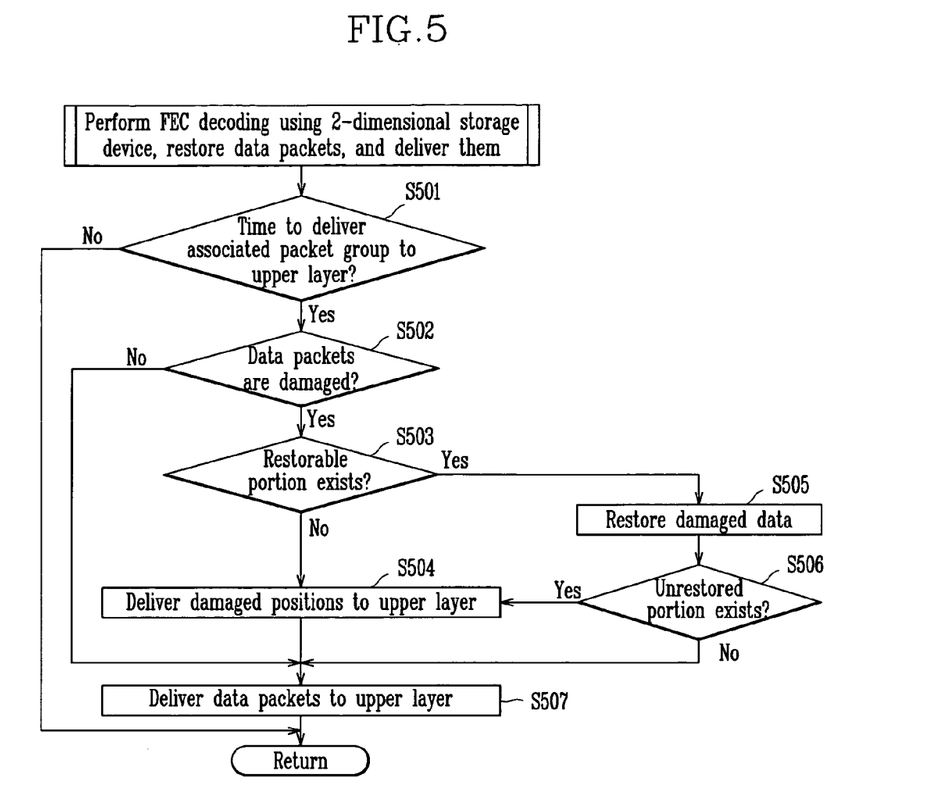
FIG. 5 shows a flowchart of the stage for performing the FEC decoding, restoring data packets, and transmitting them shown in FIG. 3.

FIG. 5 shows a flowchart of the step S305 for performing the FEC decoding, restoring the data packets, and delivering them shown in FIG. 3.

As shown, when the separated data packets in FIG. 4 are arranged to the two-dimensional storage device 200 in step S405, it is determined whether it is time to deliver an associated packet group to an upper layer in step S501.

When it is not the time to deliver the associated packet group to the upper layer, the steps S303 and S304 for receiving the extension packets are performed, and when it is the time to deliver the associated packet group to the upper layer, it is determined whether packets are lost in the associated packet group in step S502.

In this instance, the upper layer may be a synchronization layer or a decoder layer, and the time to deliver the packet group to the upper layer may be a time when the last packet in the associated packet group is arrived, or a packet in a subsequent associated packet group is arrived, or a time when a predetermined time has lapsed in the case all the packets have not arrived.

When no data packet is lost in the previous determination step S502, the received data packets are delivered to the upper layer in step S507, and when the data packets are lost, it is determined whether the lost packets have a restorable portion in step S503, and when the data have a restorable portion, parity packets are used to restore the lost data in step S505. When no unrestored portion is found after restoring the lost data, the received data including the restored data are delivered to the upper layer in step S507.

Figure 8:
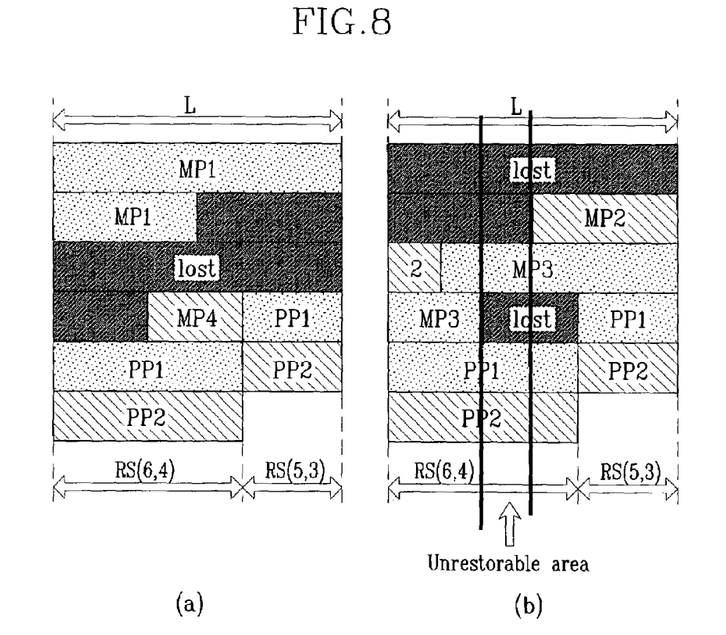

For example, by using the RS(6,4) for restoring the lost packets, four input digits generate two parity digits, and two lost digits from the six digits may be restored to the maximum. In this instance, since each packet uses the RTP protocol having the packet's sequence number so that the receiver knows the positions of the lost packets, these lost packets may be referred to as an erasure. For example, as shown in FIG. 8(a), the lost second packet P2 and the third packet P3 may be restored by the parity packets PP1 and PP2. Therefore, they are determined to be restorable in the step S503, and they are restored in the step S505.

However, when more than two bytes are lost on the horizontally identical position, the lost bytes may not be restored. For example, when the first packet P1 and the fourth packet P4 are lost as shown in FIG. 8(b), since lost three bytes are generated on the arrow-marked horizontal position, the lost packets may not be restored on this position.

When a portion in which the lost data are not restored is found as described above, the position of the lost data is delivered to the upper layer in step S504.

The case of the RS(6,4) with n=4 is described in the above, and when generally using the RS(n,k) code, the number n may be applied to the largest number $2^8$=255 in the $GF(2^8)$. Also, in the case that the network state is very bad, the number of the parity packets may be increased so as to increase (n-k).

The case of the RS(6,4) with n=4 is described in the above, and further, the present invention may be applied to other RS codes. Also it is applied to not only protocols with the packet's sequence numbers such as RTP, but also protocols without packet's sequence numbers, and in this case, a range of restoring the lost data packets may be restricted to within half of the number of the parity packets.

When the loss degree exceeds a restorable range, a portion of the lost data may not be restored, and the position of the lost portion may be delivered to the upper layer in step S504.

In the above-described preferred embodiment of the present invention, the data packets and the parity packets are arranged into the two-dimensional storage devices 100 and 200 which may be virtual storage devices or real memories. That is, a device for additionally storing the input data packets is not provided for the two-dimensional storage devices, but the two-dimensional storage devices may be virtual two-dimensional storage devices, that is, memories assigned by an application program, or real memories for separately storing the data packets in the hardwired manner.

According to the present invention, when the respective variable length data packets are input to the two-dimensional storage device, they are successively stored in it, parity packets of the associated packets are updated, and data packets are immediately transmitted, thereby minimizing the delay generated from the transmitter.

Also, since the packets lost during data transmission may be restored, the present invention provides excellent quality services, and particularly provides top quality video services when applying the present invention to Internet video services.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

We claim:

1. A method for transmitting variable length packets on the basis of FEC (forward error correction) coding, comprising:
   (a) receiving input data packets to be transmitted, the input data packets having variable lengths; and
   (b) successively storing and arranging the input data packets in a two-dimensional data array which has a predetermined length, performing the FEC coding to generate corresponding parity packets, arranging the generated parity packets in the two-dimensional data array, and transmitting the data packets, offsets that represent positions of the data packets in the two- dimensional data array, information about types of packets, and the parity packets.

2. The method of claim 1, wherein successively storing and arranging the data packets in the two-dimensional data array represents respectively concatenating the data packets and storing them in the two-dimensional storage device.

3. The method of claim 1, wherein the method further comprises before (a):
   (c) determining whether predetermined parameters for the FEC coding are to be used; and
   (d) determining parameters for the FEC coding and transmitting them when the predetermined parameters are not to be used.

4. The method of claim 3, wherein the predetermined parameters include a length of the two-dimensional data array, the number of the parity packets, and a factor for determining an associated packet group.

5. The method of claim 4, wherein the associated packet group is a set of the data packets and corresponding parity packets.

6. The method of claim 1, wherein (b) comprises:
   (i) accumulating values of factors for determining whether to transmit the parity packets;
   (ii) successively storing and arranging the input data packets in the two-dimensional data array;
   (iii) updating parity packets according to the input data packets;
   (iv) transmitting extension data packets including the input data packets and information for data packet restoration;
   (v) determining whether it is time to transmit the parity packets;
   (vi) transmitting the parity packets when it is the time to transmit the parity packets in (v); and
   (vii) resetting the factors for determining whether to transmit the parity packets in (i).

7. The method of claim 6, wherein the factors for determining whether to transmit the parity packets in (i) include at least one of a size of the input data packets, the number of the input data packets, and time information.

8. The method of claim 6, wherein the time to transmit the parity packets in (v) is at least one of:
- a time when an accumulated size of the data packets is at least equal to a predetermined size of a predetermined associated packet group,
- a time when an accumulated number of the input data packets is at least equal to a predetermined number of data packets of the predetermined associated packet group, and
- a time when an accumulated lapsed time of the predetermined associated packet group is at least equal to a predetermined time.

9. The method of claim 6, wherein a header of the extension packet includes information for data packet restoration.

10. The method of claim 6, wherein the parity packets are updated by calculating the data arranged in the two-dimensional storage device per a predetermined length.

11. The method of claim 6, wherein (vi) comprises:
- determining the number of the parity packets to be transmitted;
- determining whether the number of transmitted parity packets is equal to or greater than the number of the parity packets to be transmitted;
- transmitting an extension parity packet including one of the parity packets to be transmitted and the information for data packet restoration when the number of the transmitted parity packets is less than the number of the parity packets to be transmitted;
- accumulating the number of the transmitted parity packets; and
- resetting the parity packets and the number of the transmitted parity packets when the determined number of the transmitted parity packets is equal to or greater than the determined number of the parity packets to be transmitted.

12. The method of claim 11, wherein the number of the parity packets to be transmitted is determined according to a state of a channel on which the packets will be transmitted.

13. The method of claim 6, wherein the information for data packet restoration includes the packets' types and the packets' offsets in the case of the data packets, and it includes the packets' types and a total size of the data packets in the associated packet group in the case of the parity packets.

14. The method of claim 13, wherein the information for data packet restoration further includes the data packets' offsets in the case of the parity packets.

15. A method for receiving variable length packets on the basis of FEC (forward error correction) coding, comprising:
- (a) receiving extension packets, each of the extension packets including one of the variable length data packets and parity packets, successively storing and arranging the variable length packets in a first dimension of a two-dimensional data array which has a predetermined storage length; and
- (b) performing FEC decoding on code words aligned in a second dimension of the two-dimensional data array to restore data packets from the variable length data packets and parity packets, and delivering the data packets to an upper layer;
- wherein the extension packets include offsets, the offsets representing positions of the variable length packets in a two-dimensional transmission data array of a transmission apparatus that transmits the extension packets, when the transmission apparatus successively stores and arranges the variable length packets in the two-dimensional transmission data array, and the successively storing and arranging in the step (b) is performing based on the offsets; and
- wherein the FEC decoding corresponds to the FEC encoding used in the transmission apparatus.

16. The method of claim 15, wherein the method further comprises before (a):
- (c) determining whether predetermined parameters for the FEC decoding are to be used; and
- (d) receiving parameters from a transmitter if the predetermined parameters are not to be used.

17. The method of claim 15, wherein (a) comprises:
- (i) receiving one of the extension packets;
- (ii) determining whether the received extension packet is an extension data packet or an extension parity packet;
- (iii) separating the data packet from information for data packet restoration when the received extension packet in (ii) is an extension data packet including the data packet;
- (iv) separating the parity packet from information for data packet restoration when the received extension packet in (ii) is an extension parity packet including the parity packet; and
- (v) sequentially arranging the separated data packet and the parity packet in (iii) or (iv) in the two-dimensional data array.

18. The method of claim 15, wherein successively storing and arranging the packets in the two-dimensional data array represents concatenating the data packets and storing them in the two-dimensional data array so that the corresponding storage length may be a storage length of the two-dimensional data array.

19. The method of claim 15, wherein (b) comprises:
- (i) determining whether it is time to deliver the associated packet group to the upper layer; and
- (ii) delivering the separated data packets to the upper layer when it is determined to be the time to deliver the associated packet group to the upper layer.

20. The method of claim 19, wherein the time to deliver the associated packet group to the upper layer may be a time when the last packet in the associated packet group or a packet in a subsequent associated packet group arrives, or a time when a predetermined time has lapsed.

21. The method of claim 19, wherein (ii) comprises:
- (ii-i) determining whether the separated data packets have a lost portion;
- (ii-ii) determining whether the data packet has a restorable portion when the data packets have a lost portion;
- (ii-iii) restoring the lost data packets when the lost portion is restorable in (ii-ii);
- (ii-iv) determining whether all lost portion can not be restored in (ii-iii);
- (ii-v) delivering lost positions to the upper layer when it is determined that no restorable portion remains in (ii-ii) or when a portion is not restored in (ii-iv); and
- (ii-vi) delivering the received data packets to the upper layer when no data packet is lost in (ii-i), or delivering the received data packets including the restored data packets to the upper layer when data are restored in (ii-iii).

22. A method for transmitting variable length packets using FEC (forward error correction) coding, comprising:
- (a) receiving data packets to be transmitted, the data packets having variable lengths;
- (b) successively storing the data packets contiguously in a two-dimensional data array,
- (c) performing the FEC coding to generate corresponding parity packets, (d) successively storing the generated parity packets contiguously in the two-dimensional data array; and (e) transmitting the data packets, offsets that represent positions of the data packets in the two-dimensional data array, information about types of packets, and the parity packets.

23. A method for receiving variable length packets using FEC (forward error correction) coding, comprising:

(a) receiving extension packets, each of the extension packets including one of the variable length data packets and parity packets, successively and contiguously storing the variable length packets in a first dimension of a two-dimensional data array; and (b) performing FEC decoding on code words aligned in a second dimension of the two-dimensional data array to restore data packets from the received variable length data packets and parity packets, and delivering the data packets to an upper layer;

wherein the extension packets include offsets, the offsets representing positions of the variable length packets in a two-dimensional transmission data array of a transmission apparatus that transmits the extension packets, when the transmission apparatus successively stores and arranges the variable length packets in the two-dimensional transmission data array, and the successively storing and arranging in the step (b) is performing based on the offsets; and wherein the FEC decoding corresponds to the FEC encoding used in the transmission apparatus.

* * * * *